(12) United States Patent
Koyama et al.

(10) Patent No.: US 10,651,161 B2
(45) Date of Patent: May 12, 2020

(54) SEMICONDUCTOR DEVICE

(71) Applicant: Kabushiki Kaisha Toshiba, Minato-ku (JP)

(72) Inventors: Masahiro Koyama, Shinagawa (JP); Kentaro Ikeda, Kawasaki (JP); Kazuto Takao, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 71 days.

(21) Appl. No.: 15/909,552

(22) Filed: Mar. 1, 2018

(65) Prior Publication Data

US 2019/0164943 A1 May 30, 2019

(30) Foreign Application Priority Data

Nov. 30, 2017 (JP) ................................. 2017-230566

(51) Int. Cl.
*H01L 25/11* (2006.01)
*H01L 25/16* (2006.01)
(Continued)

(52) U.S. Cl.
CPC ............ *H01L 25/115* (2013.01); *H01L 24/49* (2013.01); *H01L 25/16* (2013.01); *H01L 25/18* (2013.01); *H01L 24/06* (2013.01); *H01L 24/16* (2013.01); *H01L 24/48* (2013.01); *H01L 2224/0603* (2013.01); *H01L 2224/16225* (2013.01); *H01L 2224/2929* (2013.01); *H01L 2224/29387* (2013.01); *H01L 2224/29388* (2013.01);
(Continued)

(58) Field of Classification Search
CPC . H01L 25/115; H01L 25/0655; H01L 25/072; H01L 25/18; H01L 25/16; H01L 24/49; H01L 24/48
See application file for complete search history.

(56) References Cited

U.S. PATENT DOCUMENTS 9,263,435 B2  2/2016  Kanazawa et al.
9,362,267 B2  6/2016  Briere et al.
(Continued)

FOREIGN PATENT DOCUMENTS

JP  2013-45979  3/2013
JP  2013-153027  8/2013
(Continued)

*Primary Examiner* — Marc Anthony Armand
(74) *Attorney, Agent, or Firm* — Oblon, McClelland, Maier & Neustadt, L.L.P.

(57) ABSTRACT

According to one embodiment, a semiconductor device includes a first transistor being normally-off, a second transistor being normally-on, and a first conductive member. The first transistor includes a first gate, a first source, a first drain, and a first semiconductor member. The first semiconductor member is provided between the first gate and the first drain and between the first source and the first drain. The second transistor includes a second gate, a second source, a second drain, and a second semiconductor member. An orientation from the first semiconductor member toward the first drain is the same as an orientation from the second semiconductor member toward the second gate, toward the second source, and toward the second drain. The first conductive member electrically connects the first drain and the second source.

20 Claims, 13 Drawing Sheets

(51) Int. Cl.
*H01L 23/00* (2006.01)
*H01L 25/18* (2006.01)

(52) U.S. Cl.
CPC .............. *H01L 2224/48091* (2013.01); *H01L 2224/48137* (2013.01); *H01L 2224/48227* (2013.01); *H01L 2224/49111* (2013.01); *H01L 2224/49175* (2013.01); *H01L 2224/73265* (2013.01); *H01L 2924/00014* (2013.01); *H01L 2924/1306* (2013.01)

(56) References Cited

U.S. PATENT DOCUMENTS

| | | |
|---|---|---|
| 2013/0187627 A1 | 7/2013 | Imada et al. |
| 2014/0284662 A1 | 9/2014 | Ikeda |
| 2014/0306238 A1 | 10/2014 | Taniguchi et al. |
| 2016/0056131 A1 | 2/2016 | Satoh et al. |
| 2017/0317015 A1* | 11/2017 | Lee .................... H01L 23/3114 |

FOREIGN PATENT DOCUMENTS

| | | |
|---|---|---|
| JP | 2013-211548 | 10/2013 |
| JP | 2013-222905 | 10/2013 |
| JP | 2014-203919 | 10/2014 |
| JP | 2015-92609 | 5/2015 |
| JP | 5813781 | 11/2015 |
| JP | 5996465 | 9/2016 |
| WO | WO 2014/192348 A1 | 12/2014 |
| WO | WO 2016/185745 A1 | 11/2016 |

\* cited by examiner

SEMICONDUCTOR DEVICE

CROSS-REFERENCE TO RELATED APPLICATIONS

This application is based upon and claims the benefit of priority from Japanese Patent Application No. 2017-230566, filed on Nov. 30, 2017; the entire contents of which are incorporated herein by reference.

FIELD

Embodiments described herein relate generally to a semiconductor device.

BACKGROUND

There is a semiconductor device that includes two transistors connected to each other. It is desirable to suppress the emission of noise in the semiconductor device.

DETAILED DESCRIPTION

Figure 1A:
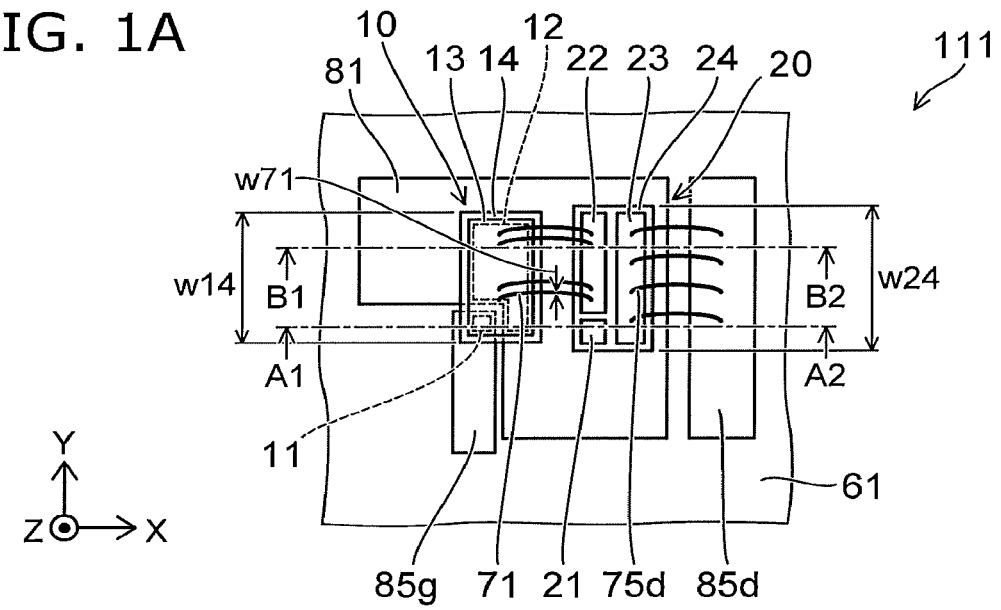
FIG. 1A to FIG. 1C are schematic views illustrating a semiconductor device according to a first embodiment.

According to one embodiment, a semiconductor device includes a first transistor being normally-off, a second transistor being normally-on, and a first conductive member. The first transistor includes a first gate, a first source, a first drain, and a first semiconductor member. A direction from the first gate toward the first source crosses a first direction. The first direction is from the first semiconductor member toward the first drain. The first semiconductor member is provided between the first gate and the first drain in the first direction and between the first source and the first drain in the first direction. The second transistor includes a second gate, a second source, a second drain, and a second semiconductor member. An orientation from the first semiconductor member toward the first drain is the same as an orientation from the second semiconductor member toward the second gate, the same as an orientation from the second semiconductor member toward the second source, and the same as an orientation from the second semiconductor member toward the second drain. An orientation from the first semiconductor member toward the second semiconductor member crosses the first direction. The first conductive member electrically connects the first drain and the second source.

According to another embodiment, a semiconductor device includes a first member, a first transistor being normally-off, a second transistor being normally-off, and a first conductive member. The first transistor includes a first gate, a first source, a first drain, and a first semiconductor member. A direction from the first member toward the first drain is aligned with a first direction. The first semiconductor member is positioned between the first member and the first drain in the first direction. The first gate is positioned between the first member and the first semiconductor member in the first direction. The first source is positioned between the first member and the first semiconductor member in the first direction. The second transistor includes a second gate, a second source, a second drain, and a second semiconductor member. The second semiconductor member is positioned between the first member and the second gate in the first direction. The second semiconductor member is positioned between the first member and the second source in the first direction. The second semiconductor member is positioned between the first member and the second drain in the first direction. A direction from the first semiconductor member toward the second semiconductor member crosses the first direction. The first conductive member electrically connects the first drain and the second source.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
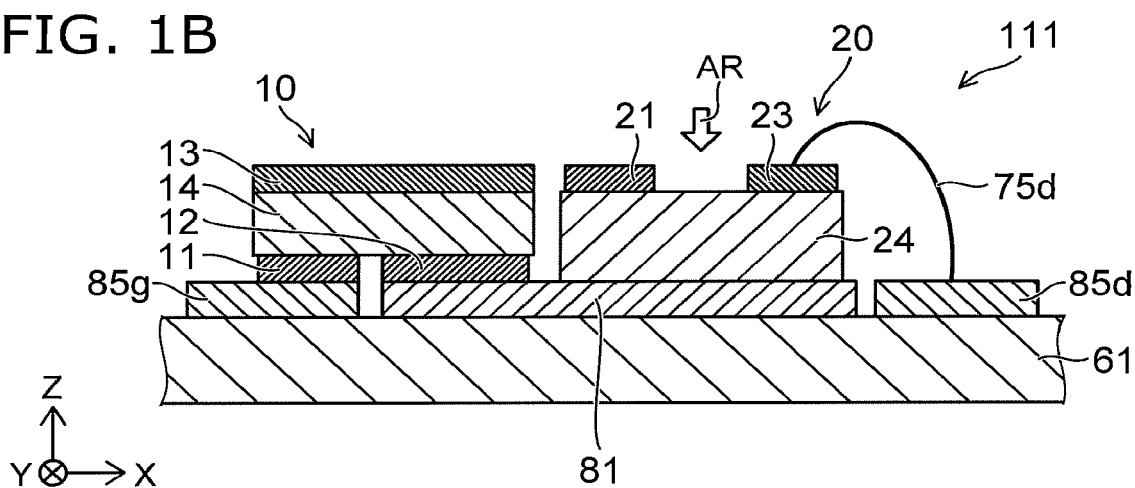
Figure 1C:
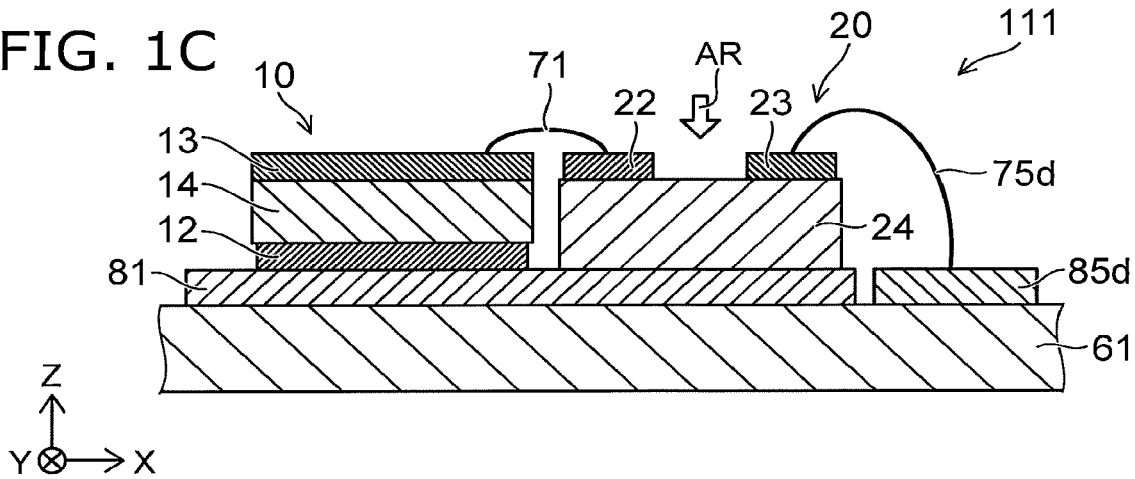

FIG. 1A to FIG. 1C are schematic views illustrating a semiconductor device according to a first embodiment. FIG. 1A is a plan view as viewed along arrow AR of FIG. 1B and FIG. 1C. FIG. 1B is a line A1-A2 cross-sectional view of FIG. 1A. FIG. 1C is a line B1-B2 cross-sectional view of FIG. 1A.

As shown in FIG. 1A to FIG. 1C, the semiconductor device 111 according to the embodiment includes a first transistor 10 that is normally-off, a second transistor 20 that is normally-on, and a first conductive member 71. In the example, the semiconductor device 111 further includes a first member 61. The first member 61 is, for example, a substrate. For example, the front surface of the first member 61 is insulative.

The first transistor 10 includes a first gate 11, a first source 12, a first drain 13, and a first semiconductor member 14 (e.g., a semiconductor layer).

The direction from the first semiconductor member 14 toward the first drain 13 is taken as a first direction. In the case where the first member 61 is provided, the direction from the first member 61 toward the first drain 13 may be taken as the first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the first gate 11 toward the first source 12 crosses the first direction (the Z-axis direction). The direction from the first gate 11 toward at least a portion of the first source 12 is, for example, the X-axis direction.

The first semiconductor member 14 is provided between the first gate 11 and the first drain 13 in the first direction (the Z-axis direction) and between the first source 12 and the first drain 13 in the first direction.

The second transistor 20 includes a second gate 21, a second source 22, a second drain 23, and a second semiconductor member 24 (e.g., a semiconductor layer). The orientation from the second semiconductor member 24 toward the second gate 21, the orientation from the second semiconductor member 24 toward the second source 22, and the orientation from the second semiconductor member 24 toward the second drain 23 are the same as the orientation from the first semiconductor member 14 toward the first drain 13.

The orientation from the first semiconductor member 14 toward the second semiconductor member 24 crosses the first direction (the Z-axis direction). In the example, the orientation from the first semiconductor member 14 toward the second semiconductor member 24 is aligned with the X-axis direction.

As described above, the first member 61 is provided in the example. The first transistor 10 and the second transistor 20 are provided on the first member 61. The first gate 11 and the first source 12 are provided on the first member 61. The first semiconductor member 14 is provided on the first gate 11 and the first source 12. The first drain 13 is provided on the first semiconductor member 14.

The second transistor 20 is provided on the first member 61. The second semiconductor member 24 is provided on the first member 61. The second gate 21, the second source 22, and the second drain 23 are provided on the second semiconductor member 24.

For example, the first semiconductor member 14 is positioned between the first member 61 and the first drain 13. The first gate 11 is positioned between the first member 61 and the first semiconductor member 14. The first source 12 is positioned between the first member 61 and the first semiconductor member 14.

For example, the second semiconductor member 24 is positioned between the first member 61 and the second gate 21. The second semiconductor member 24 is positioned between the first member 61 and the second source 22. The second semiconductor member 24 is positioned between the first member 61 and the second drain 23.

The first conductive member 71 electrically connects the first drain 13 and the second source 22. The first conductive member 71 is, for example, an interconnect (e.g., a wire). The first drain 13 of the first transistor 10 and the second source 22 of the second transistor 20 are electrically connected by the first conductive member 71. The first transistor 10 and the second transistor 20 are electrically connected. The connection is, for example, a cascode connection.

For example, the normally-off first transistor 10 and the normally-on second transistor 20 have a cascode connection. Thereby, a normally-off operation is performed in the semiconductor device 111. For example, the first transistor 10 is a silicon transistor having a low breakdown voltage. For example, the second transistor 20 is a nitride semiconductor transistor having a high breakdown voltage. For example, the semiconductor device 111 functions as a high breakdown voltage transistor that is normally-off.

In the semiconductor device 111, the potential of the node connected to the two transistors (the connection point connected to the first drain 13 and the second source 22) fluctuates easily according to the switching operation. The fluctuation of the potential of the node is noise. For example, the node (the conductive body) becomes an antenna emitting the noise. For example, a large noise is emitted easily in the case where the size of the conductive body of the node is large.

In the embodiment, the first drain 13 and the second source 22 are electrically connected by the first conductive member 71 such as a wire or the like. The size of the node (the first conductive member 71) electrically connected to the first drain 13 and the second source 22 is small. Therefore, the emission of the noise is suppressed.

For example, in a first reference example, the first transistor 10 and the second transistor 20 are provided on the first member 61. In the first reference example, the first drain 13 is provided on the first member 61; the first semiconductor member 14 is provided on the first drain 13; and the first gate and the first source 12 are provided on the first semiconductor member 14. On the other hand, the second transistor 20 is provided similarly to that of the semiconductor device 111. In the first reference example, the first drain 13 is positioned under the first semiconductor member 14; and the second source 22 is positioned on the second semiconductor member 24. Therefore, the distance of the electrical connection between the first drain 13 and the second source 22 is longer. For example, an electrode pad is provided under the first drain 13; and the electrode pad and the second source 22 are connected by a wire or the like. In such a first reference example, the node that is electrically connected to the first drain 13 and the second source 22 is large; and a large noise is emitted easily.

Conversely, in the embodiment, the first drain 13 and the second source 22 are positioned on the same side when viewed from the first semiconductor member 14 and the second semiconductor member 24. The first drain 13 and the second source 22 are directly connected electrically by the first conductive member 71. The size of the node (the first conductive member 71) is small. Therefore, the emission of the noise is suppressed. In the embodiment, for example, the electrical connection between the first drain 13 and the second source 22 is performed without going through an electrode pad. The electrical direct connection between the first drain 13 and the second source 22 includes a connection via solder.

For example, in a second reference example, the first transistor 10 is provided on the upper surface of a substrate; and the second transistor 20 is provided on the lower surface of the substrate. In such a case, the first transistor 10 (the first drain 13) and the second transistor 20 (the second source 22) are electrically connected by a conductive body or the like piercing the substrate. In such a case, the first drain 13 and the conductive body piercing the substrate are electrically connected. The second source 22 and the conductive body piercing the substrate are electrically connected. To stably obtain these connections, the size of the conductive body is set to be large considering the positional precision. Therefore, the suppression of the emission of the noise is insufficient. Further, in the second reference example, the components are complex because the conductive body piercing the substrate is formed.

Conversely, in the embodiment, the two transistors are provided on the same side of the first member 61 (e.g., the substrate). Therefore, the components are simple. The size of the first conductive member 71 (the conductive body) easily can be set to be small. A semiconductor device of simple members can be provided while suppressing the emission of the noise.

As shown in FIG. 1C, a first conductive layer 81 is further provided in the example. The first conductive layer 81 is provided between the first member 61 and the first source 12 and between the first member 61 and the second semiconductor member 24. The first conductive layer 81 is electrically connected to the first source 12. For example, a portion of the first conductive layer 81 functions as a source pad.

For example, the second transistor 20 overlaps the first conductive layer 81. For example, the first conductive layer 81 is set to a ground potential. The fluctuation of the ground potential is relatively small. For example, the ground potential substantially does not fluctuate. The operation of the second transistor 20 is stabilized easily by providing the second transistor 20 to overlap such a first conductive layer 81.

In the case where the second transistor 20 overlaps the first conductive layer 81, it is favorable for the surface (e.g., the lower surface) of the second transistor 20 opposing the first conductive layer 81 to be insulative.

As shown in FIG. 1B and FIG. 1C, a gate pad 85g, a drain pad 85d, and a drain interconnect 75d are provided in the example. The gate pad 85g is provided between the first member 61 and the first gate 11. The drain pad 85d is provided on a portion of the first member 61. The drain interconnect 75d electrically connects the second drain 23 and the drain pad 85d. For example, the gate pad 85g functions as an input portion of the semiconductor device 111. For example, a high voltage (a power supply voltage Vdd) is applied to the drain pad 85d. For example, the source pad (the first conductive layer 81) is grounded. The power supply voltage Vdd is higher than the potential of the first conductive layer 81 (the source pad).

In the embodiment, it is favorable for the width of the first conductive member 71 not to be excessively wide. Thereby, the size of the first conductive member 71 can be set to be appropriately small.

The first conductive member 71 has a width w71 as shown in FIG. 1A. The width w71 is the width of the first conductive member 71 along a cross direction (e.g., the Y-axis direction) crossing the direction (e.g., the X-axis direction) in which the first conductive member 71 extends. The first semiconductor member 14 has a width w14. The width w14 is the width of the first semiconductor member 14 along the cross direction (the Y-axis direction). In the embodiment, it is favorable for the width w71 to be narrower than the width w14. The second semiconductor member 24 has a width w24. The width w24 is the width of the second semiconductor member 24 along the cross direction (the Y-axis direction). In the embodiment, it is favorable for the width w71 to be narrower than the width w24.

For example, the width w71 of the first conductive member 71 is $\frac{1}{5}$ of the width w14 of the first semiconductor member 14 or less. The emission of the noise can be suppressed further. The width w71 of the first conductive member 71 is $\frac{1}{5}$ of the width w24 of the second semiconductor member 24 or less. The emission of the noise can be suppressed further. The width w71 may be $\frac{1}{10}$ of the width w14 or less. The width w71 may be $\frac{1}{10}$ of the width w24 or less.

In the embodiment, for example, the surface area of the first conductive member 71 when projected onto the X-Y plane is less than the surface area of the first conductive layer 81 (e.g., the source pad, e.g., the conductive body electrically connected to the first source 12) when projected onto the X-Y plane. For example, the former is $\frac{1}{10}$ of the latter or less. In the embodiment, for example, the surface area of the first conductive member 71 when projected onto the X-Y plane is less than the surface area of the drain pad 85d (e.g., the conductive body electrically connected to the second drain 23) when projected onto the X-Y plane. For example, the former is $\frac{1}{10}$ of the latter or less.

In the embodiment, it is favorable for the length of the first conductive member 71 to be short. Therefore, it is favorable for the distance between the second source 22 and the first drain 13 to be short.

For example, the direction from the second source 22 toward the second drain 23 is taken as a second direction. In the example, the second direction is the X-axis direction. The position of the second source 22 in the second direction is between the position of the first drain 13 in the second direction and the position of the second drain 23 in the second direction. Thereby, for example, the length of the first conductive member 71 can be set to be short. For example, the emission of the noise can be suppressed further.

Figure 2A:
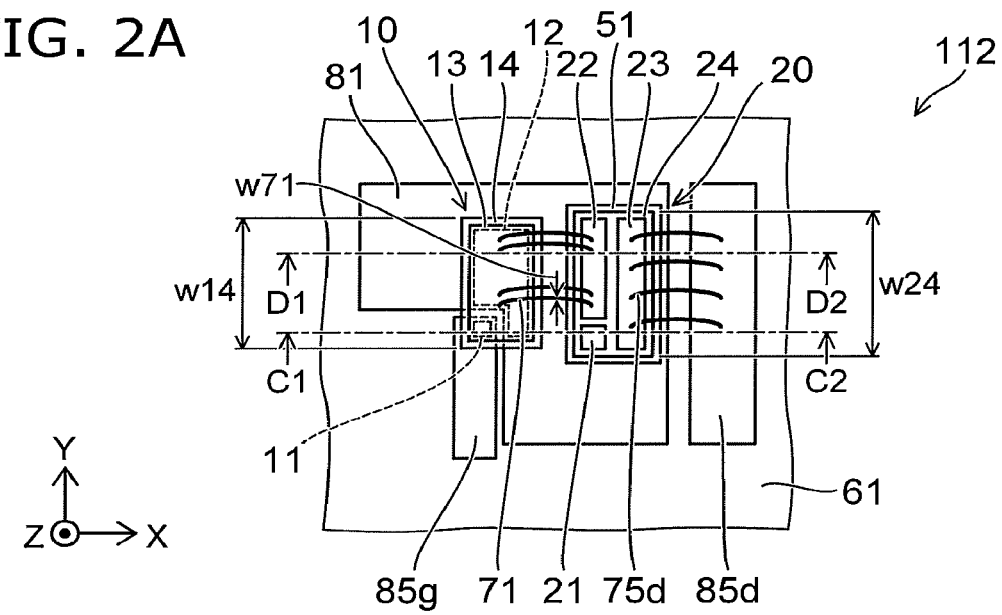
FIG. 2A to FIG. 2C are schematic views illustrating another semiconductor device according to the first embodiment.
Figure 2B:
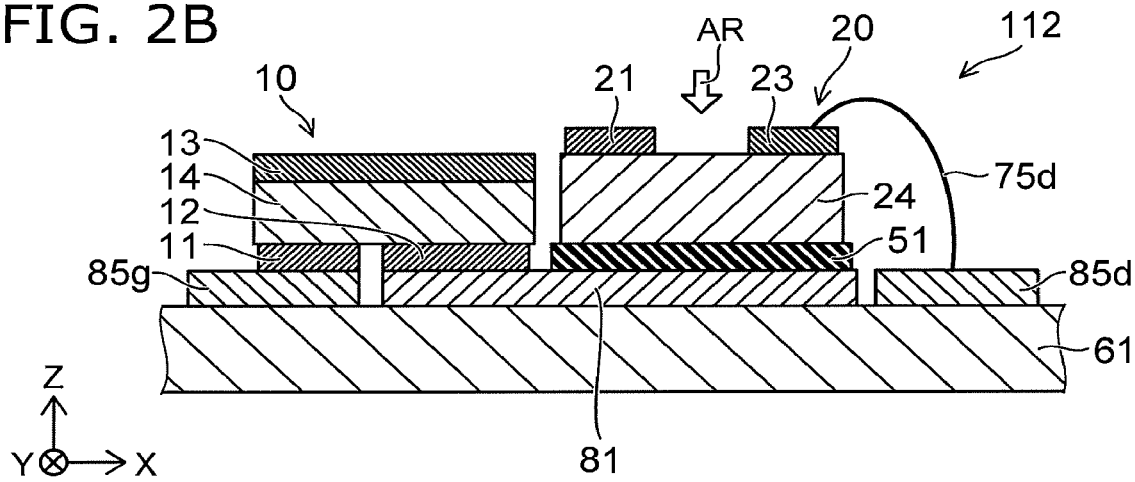
Figure 2C:
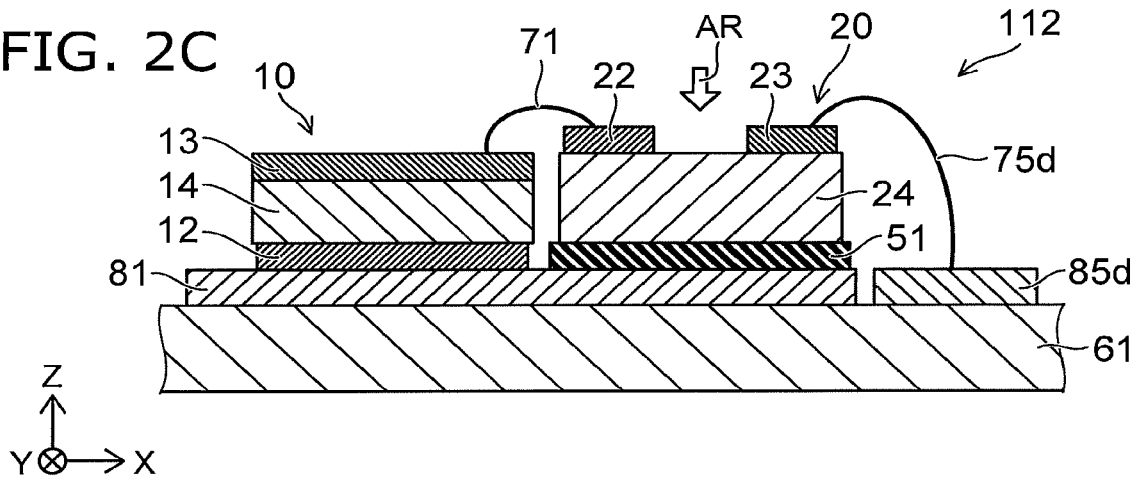

FIG. 2A to FIG. 2C are schematic views illustrating another semiconductor device according to the first embodiment.

FIG. 2A is a plan view as viewed along arrow AR of FIG. 2B and FIG. 2C. FIG. 2B is a line C1-C2 cross-sectional view of FIG. 2A. FIG. 2C is a line D1-D2 cross-sectional view of FIG. 2A.

As shown in FIG. 2A to FIG. 2C, the semiconductor device 112 includes a first insulating layer 51 in addition to the first transistor 10, the second transistor 20, and the first conductive member 71. The first insulating layer 51 is provided between the first conductive layer 81 and the second semiconductor member 24. Otherwise, the configuration of the semiconductor device 112 is similar to the configuration of the semiconductor device 111.

Because the first insulating layer 51 is provided in the semiconductor device 112, the surface (e.g., the lower surface) of the second transistor 20 opposing the first conductive layer 81 may be conductive. Stable insulation is obtained by the first insulating layer 51. The first insulating layer 51 includes, for example, at least one selected from the group consisting of glass fibers (e.g., a glass fiber cloth or a glass fiber layer), an epoxy resin, a polyimide resin, and a ceramic. The first insulating layer 51 may include, for example, a glass epoxy substrate.

Figure 3A:
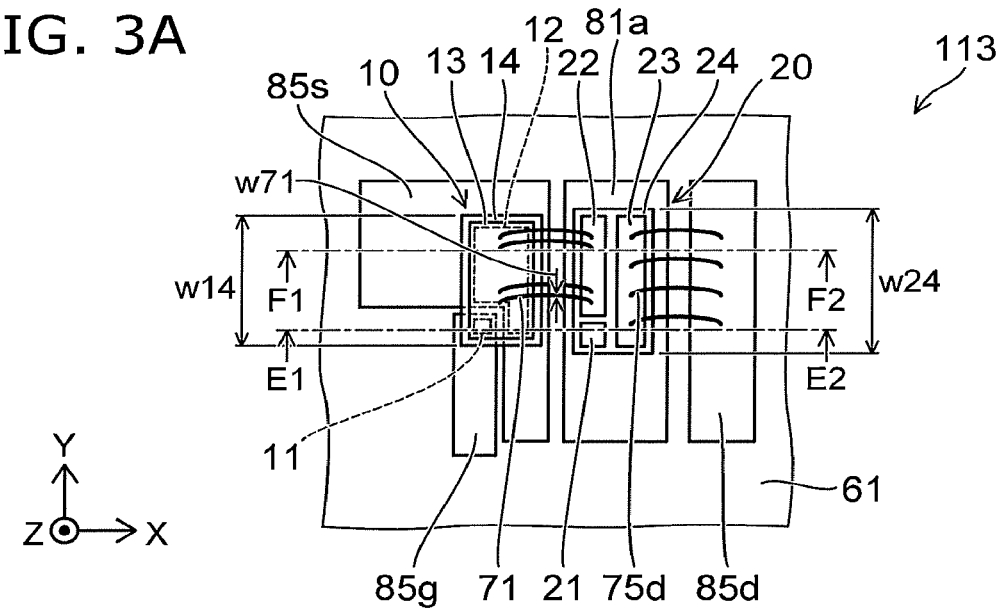
FIG. 3A to FIG. 3C are schematic views illustrating another semiconductor device according to the first embodiment.
Figure 3B:
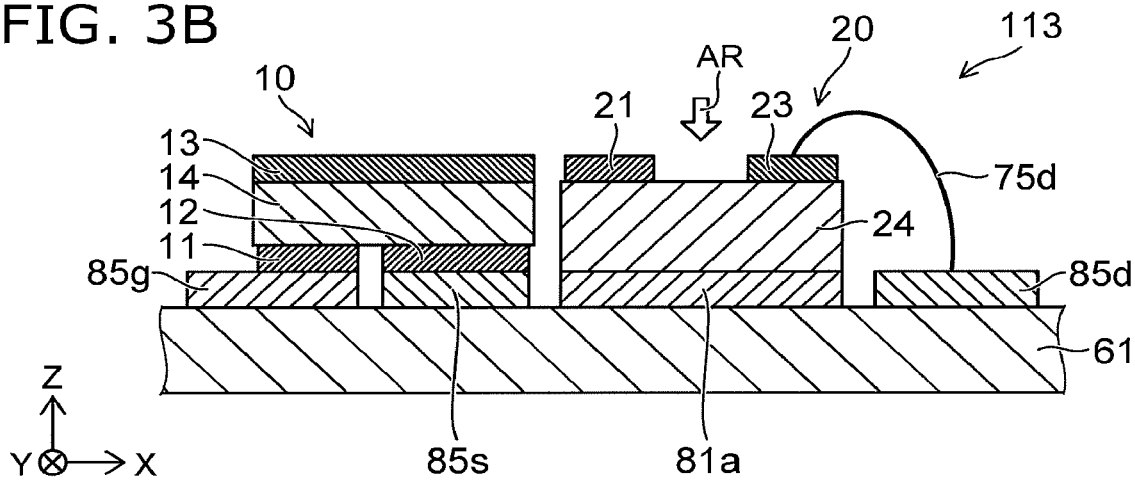
Figure 3C:
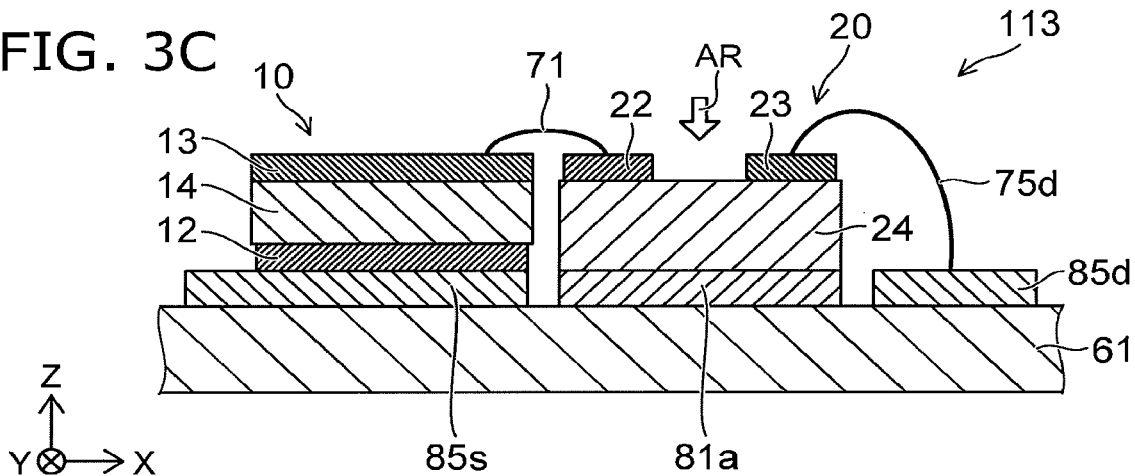

FIG. 3A to FIG. 3C are schematic views illustrating another semiconductor device according to the first embodiment.

FIG. 3A is a plan view as viewed along arrow AR of FIG. 3B and FIG. 3C. FIG. 3B is a line E1-E2 cross-sectional view of FIG. 3A. FIG. 3C is a line F1-F2 cross-sectional view of FIG. 3A.

As shown in FIG. 3A to FIG. 3C, the semiconductor device 113 includes a first conductive layer 81a and a source pad 85s in addition to the first transistor 10, the second transistor 20, and the first conductive member 71. The first conductive layer 81a is provided between the first member 61 and the second semiconductor member 24. The source pad 85s is provided between the first member 61 and the first source 12. Otherwise, the configuration of the semiconductor device 112 is similar to the configuration of the semiconductor device 111.

In the semiconductor device 113, the first conductive layer 81a is electrically insulated from the first gate 11, the first source 12, the first drain 13, the second gate 21, the second source 22, and the second drain 23. The first conductive layer 81a is, for example, a floating pad. In the example, the surface (e.g., the lower surface) of the second transistor 20 opposing the first conductive layer 81a may be conductive.

In the semiconductor devices 112 and 113 as well, the emission of the noise can be suppressed.

Figure 4A:
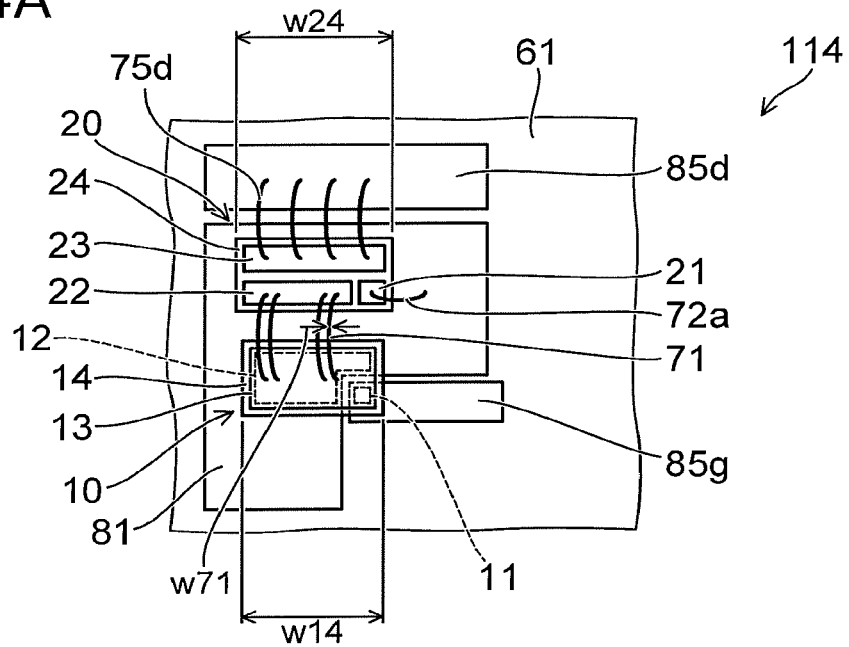
FIG. 4A and FIG. 4B are schematic views illustrating another semiconductor device according to the first embodiment.
Figure 4B:
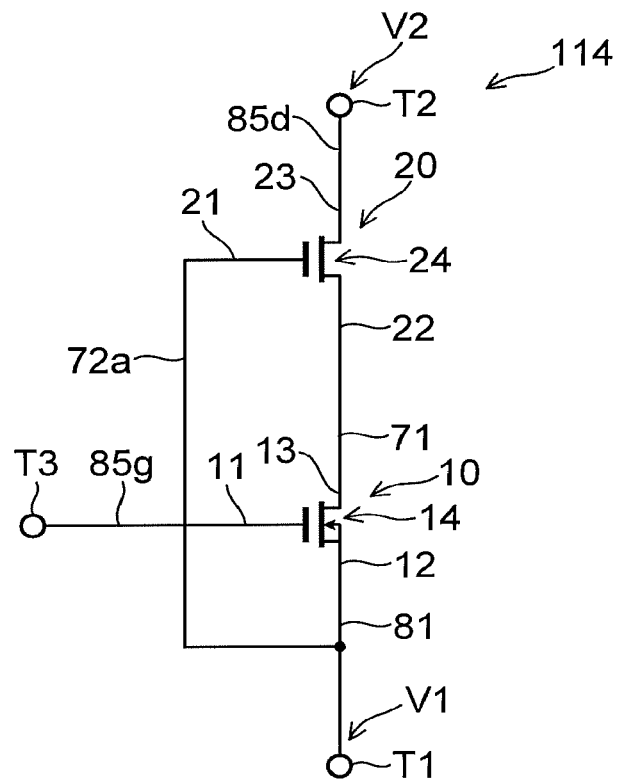

FIG. 4A and FIG. 4B are schematic views illustrating another semiconductor device according to the first embodiment.

FIG. 4A is a schematic plan view. FIG. 4B is an equivalent circuit.

As shown in FIG. 4A, the semiconductor device 114 includes a second conductive member 72a in addition to the first transistor 10, the second transistor 20, and the first conductive member 71. The second conductive member 72a is an interconnect (e.g., a wire), etc. The second conductive member 72a electrically connects the first source 12 and the second gate 21. The electrical connection is performed via the first conductive layer 81. Otherwise, the configuration of the semiconductor device 114 is similar to the configuration of the semiconductor device 111.

As shown in FIG. 4B, the first conductive layer 81 (e.g., the source pad) is connected to a first terminal T1. The first terminal T1 is set to a first potential V1. The first terminal T1 is, for example, a source terminal. For example, the drain pad 85d is connected to a second terminal T2. The second terminal T2 is set to a second potential V2. The second potential V2 is, for example, the power supply voltage Vdd. The second terminal T2 is, for example, a drain terminal. The gate pad 85g is connected to a third terminal T3. The third terminal T3 is a gate terminal. The first source 12 and the second gate 21 are electrically connected.

Figure 5A:
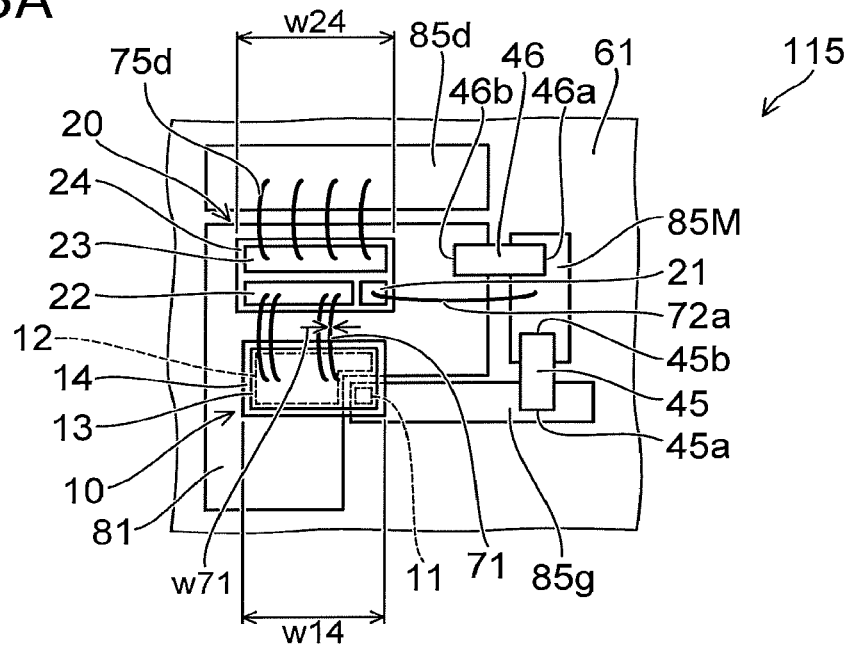
FIG. 5A and FIG. 5B are schematic views illustrating another semiconductor device according to the first embodiment.
Figure 5B:
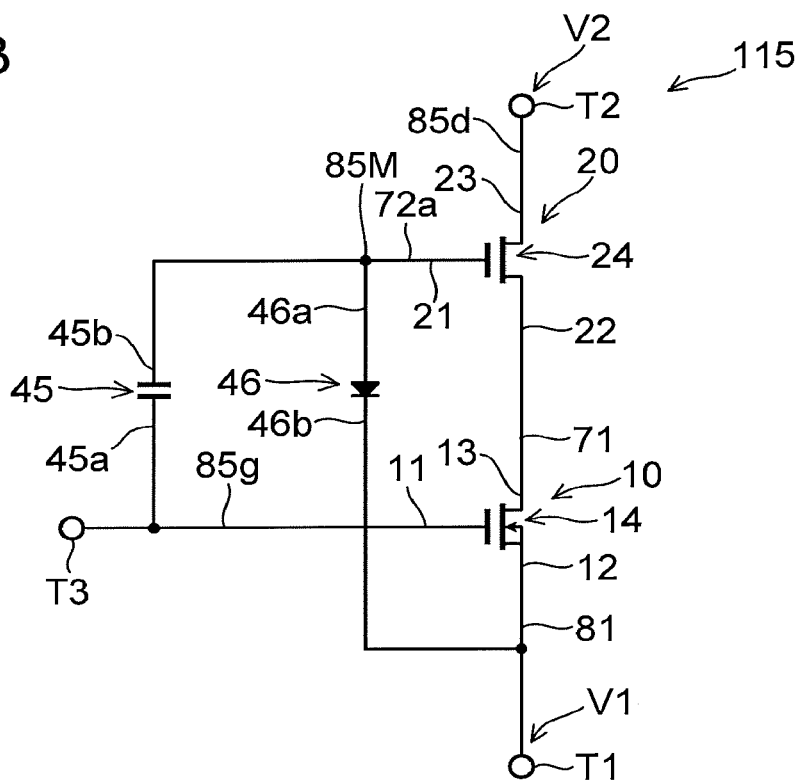

FIG. 5A and FIG. 5B are schematic views illustrating another semiconductor device according to the first embodiment.

FIG. 5A is a schematic plan view. FIG. 5B is an equivalent circuit.

As shown in FIG. 5A, the semiconductor device 115 includes a first capacitor 45 and a first diode 46 in addition to the first transistor 10, the second transistor 20, and the first conductive member 71. Otherwise, the configuration of the semiconductor device 115 is similar to the configuration of the semiconductor device 111.

As shown in FIG. 5A and FIG. 5B, the first capacitor 45 has a first end 45a and a second end 45b. The first end 45a is electrically connected to the first gate 11. The second end 45b is electrically connected to the second gate 21.

The second conductive member 72a and a pad 85M are provided in the example. For example, the pad 85M is provided on the first member 61. The second conductive member 72a is electrically connected to the second gate 21 and the pad 85M. The second end 45b of the first capacitor 45 is electrically connected to the pad 85M. In the example, the second end 45b is electrically connected to the second gate 21 via the pad 85M and the second conductive member 72a.

The first diode 46 includes a first anode 46a and a first cathode 46b. The first anode 46a is electrically connected to the second gate 21. In the example, the first anode 46a is electrically connected to the second gate 21 via the pad 85M and the second conductive member 72a. The first cathode 46b is electrically connected to the first source 12. In the example, the first cathode 46b is electrically connected to the first source 12 via the first conductive layer 81.

Figure 6:
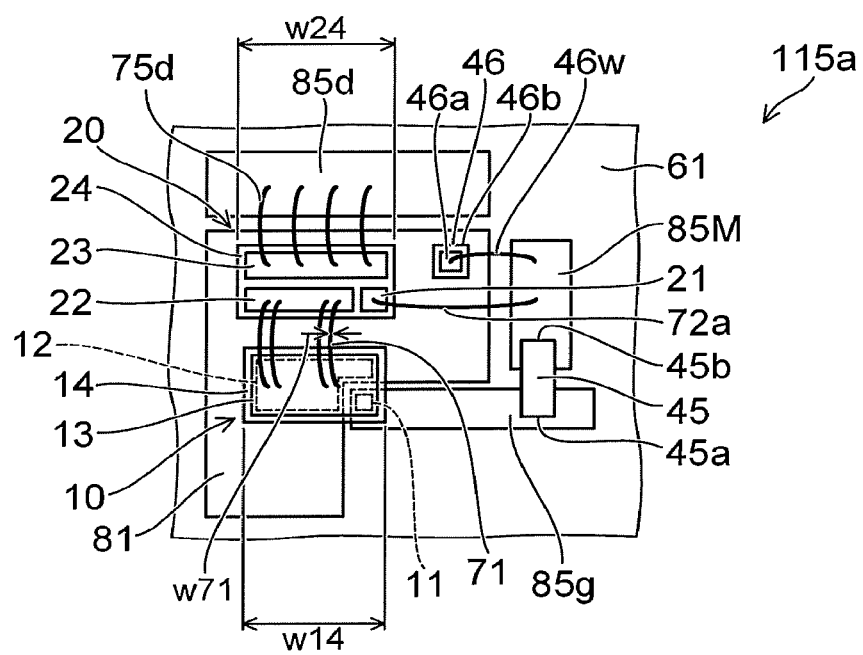
FIG. 6 is a schematic plan view illustrating another semiconductor device according to the first embodiment.

FIG. 6 is a schematic plan view illustrating another semiconductor device according to the first embodiment.

As shown in FIG. 6, the first diode 46 is provided in the semiconductor device 115a as well. The first cathode 46b is electrically connected to the first source 12 via the first conductive layer 81. The first anode 46a is electrically connected to the pad 85M via an interconnect 46w.

The emission of the noise can be suppressed in the semiconductor devices 114, 115, and 115a as well.

Figure 7A:
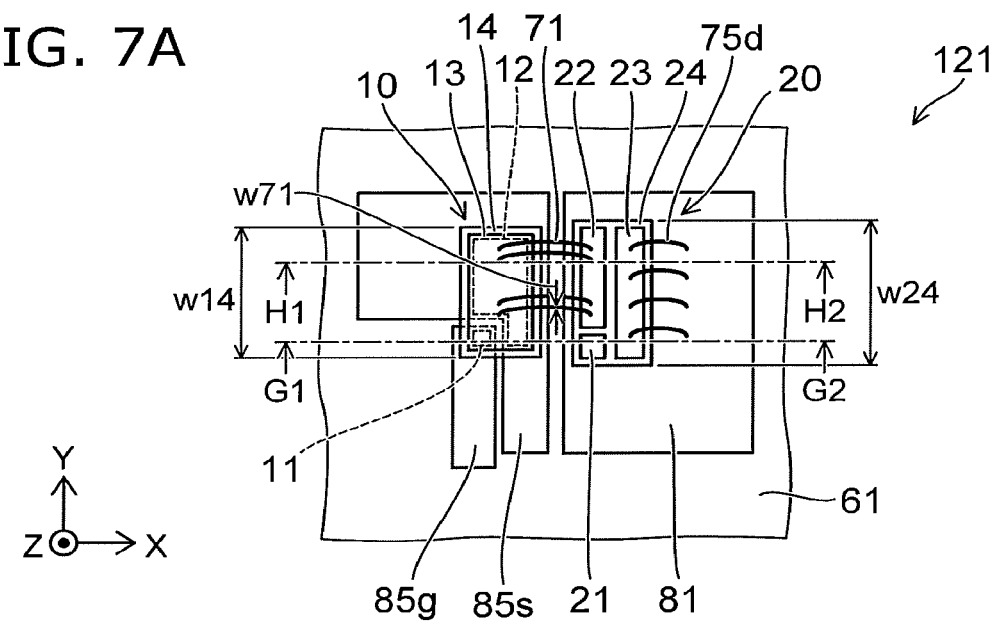
FIG. 7A to FIG. 7C are schematic views illustrating another semiconductor device according to the first embodiment.
Figure 7B:
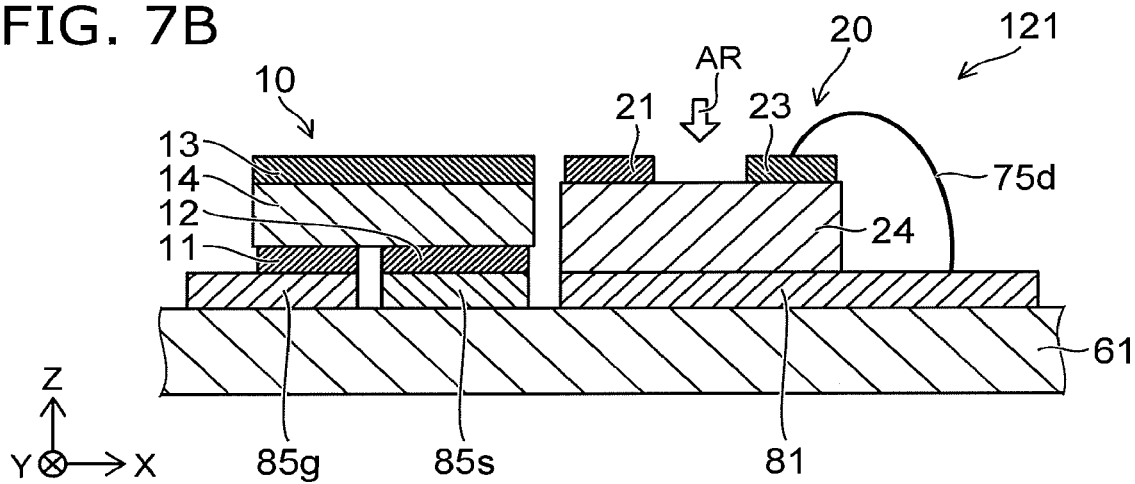
Figure 7C:
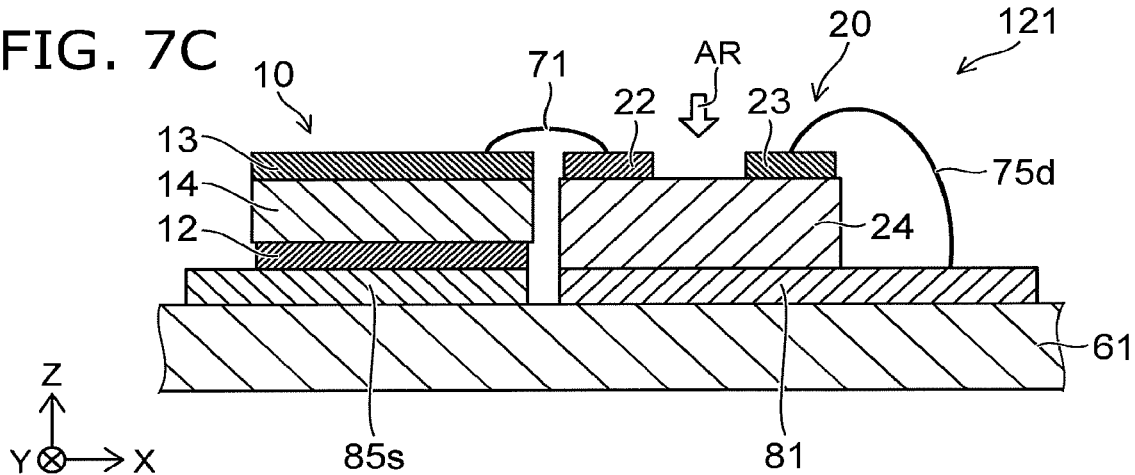

FIG. 7A to FIG. 7C are schematic views illustrating another semiconductor device according to the first embodiment.

FIG. 7A is a plan view as viewed along arrow AR of FIG. 7B and FIG. 7C. FIG. 7B is a line G1-G2 cross-sectional view of FIG. 7A. FIG. 7C is a line H1-H2 cross-sectional view of FIG. 7A.

As shown in FIG. 7A to FIG. 7C, the semiconductor device 121 includes the first conductive layer 81 in addition to the first transistor 10, the second transistor 20, and the first conductive member 71. In the semiconductor device 121, the first conductive layer 81 is electrically connected to the second drain 23. The drain interconnect 75d is provided in the example. The drain interconnect 75d electrically connects the second drain 23 and the first conductive layer 81. Thereby, the first conductive layer 81 is electrically connected to the second drain 23. The source pad 85s is provided between the first member 61 and the first source 12. Otherwise, the configuration of the semiconductor device 121 is similar to the configuration of the semiconductor device 111.

In the semiconductor device 121, at least a portion of the first conductive layer 81 is positioned between the first member 61 and the second semiconductor member 24. The second transistor 20 overlaps the first conductive layer 81. For example, the second drain 23 is set to the second potential V2 (e.g., the power supply voltage Vdd). The fluctuation of the second potential V2 is relatively small. The operation of the second transistor 20 is stabilized easily by the second transistor 20 overlapping the first conductive layer 81.

In the embodiment, for example, the surface area of the first conductive member 71 when projected onto the X-Y plane is less than the surface area of the first conductive layer 81 (e.g., the drain pad, e.g., the conductive body electrically connected to the second drain 23) when projected onto the X-Y plane. For example, the former is 1/10 of the latter or less. In the embodiment, for example, the surface area of the first conductive member 71 when projected onto the X-Y plane is less than the surface area of the source pad 85s (e.g., the conductive body electrically connected to the first source 12) when projected onto the X-Y plane. For example, the former is ¹⁄₁₀ of the latter or less.

Figure 8A:
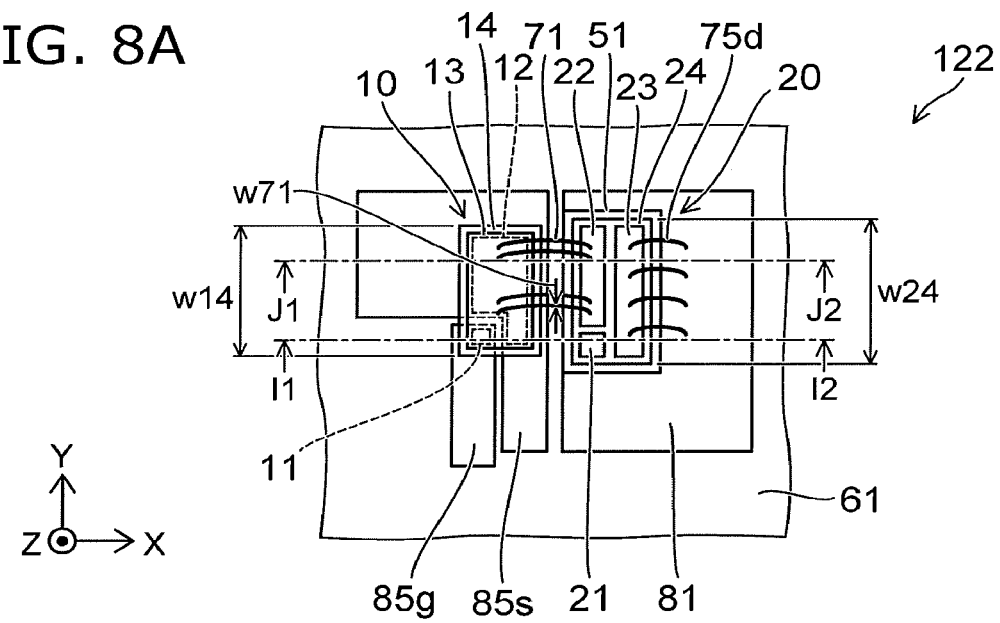
FIG. 8A to FIG. 8C are schematic views illustrating another semiconductor device according to the first embodiment.
Figure 8B:
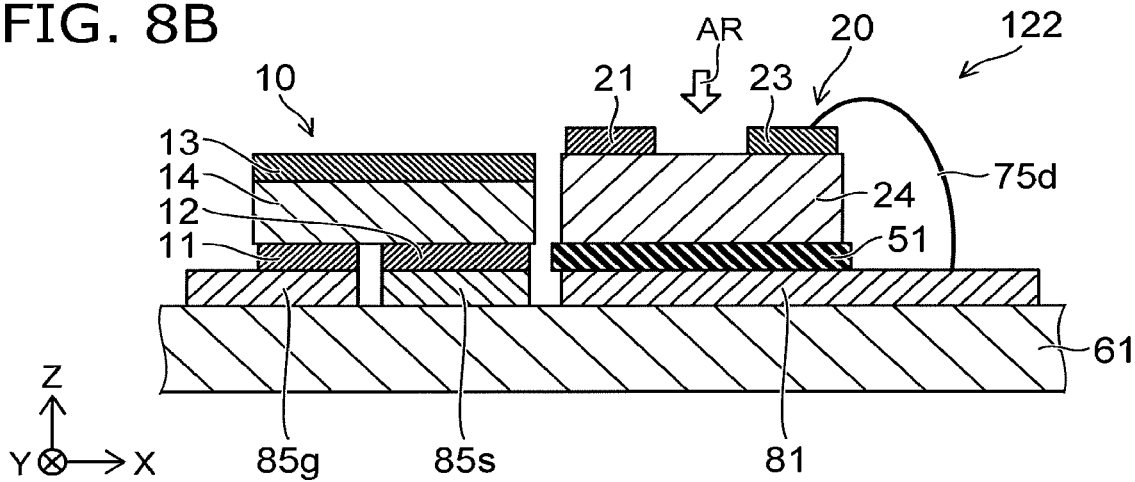
Figure 8C:
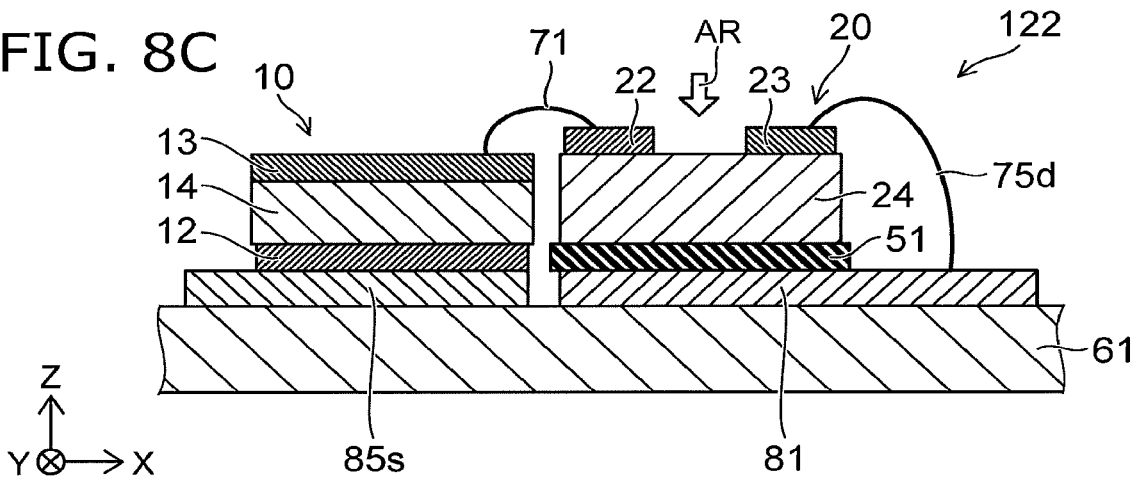

FIG. 8A to FIG. 8C are schematic views illustrating another semiconductor device according to the first embodiment.

FIG. 8A is a plan view as viewed along arrow AR of FIG. 8B and FIG. 8C. FIG. 8B is a line 11-12 cross-sectional view of FIG. 8A. FIG. 8C is a line 31-32 cross-sectional view of FIG. 8A.

As shown in FIG. 8A to FIG. 8C, the semiconductor device 122 includes the first insulating layer 51 in addition to the first transistor 10, the second transistor 20, the first conductive member 71, and the first conductive layer 81. The first conductive layer 81 is electrically connected to the second drain 23. The first insulating layer 51 is provided between the first member 61 and the second semiconductor member 24. In the semiconductor device 122, the surface (e.g., the lower surface) of the second transistor 20 opposing the first conductive layer 81 may be conductive.

Figure 9A:
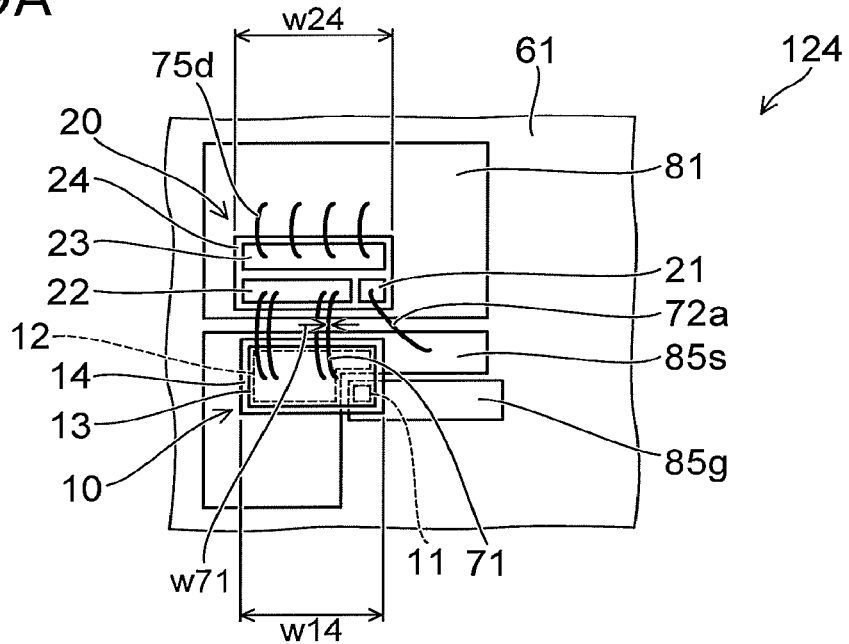
FIG. 9A and FIG. 9B are schematic views illustrating another semiconductor device according to the first embodiment.
Figure 9B:
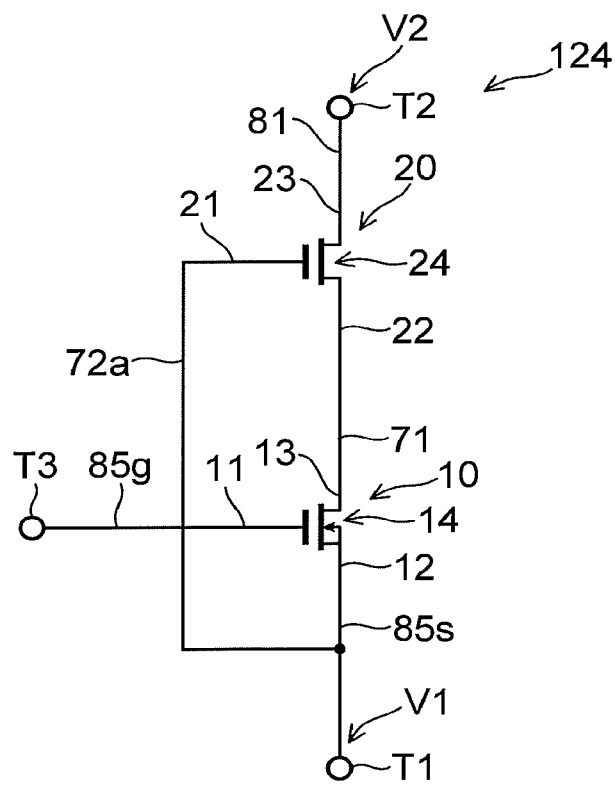

FIG. 9A and FIG. 9B are schematic views illustrating another semiconductor device according to the first embodiment.

FIG. 9A is a schematic plan view. FIG. 9B is an equivalent circuit.

As shown in FIG. 9A and FIG. 9B, the semiconductor device 124 includes the second conductive member 72a in addition to the first transistor 10, the second transistor 20, and the first conductive member 71. The second conductive member 72a electrically connects the first source 12 and the second gate 21. The electrical connection is performed via the source pad 85s. Otherwise, the configuration of the semiconductor device 124 is similar to the configuration of the semiconductor device 121.

Figure 10A:
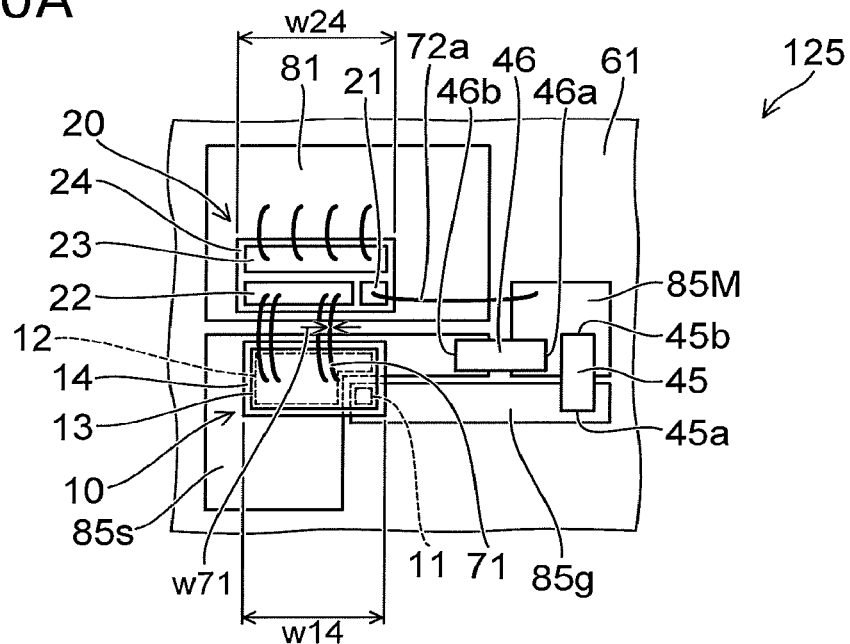
FIG. 10A and FIG. 10B are schematic views illustrating another semiconductor device according to the first embodiment.
Figure 10B:
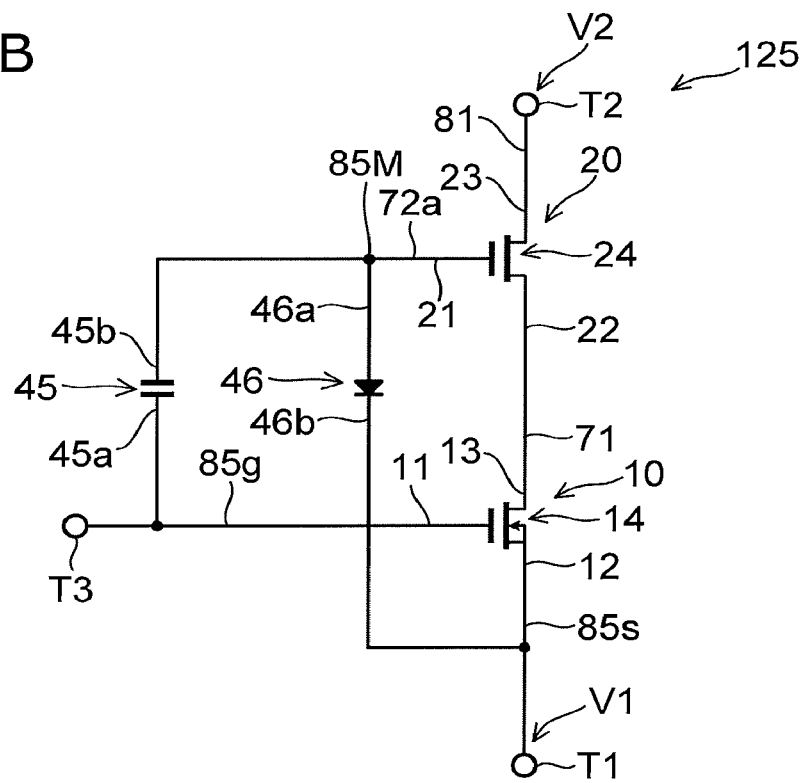

FIG. 10A and FIG. 10B are schematic views illustrating another semiconductor device according to the first embodiment.

FIG. 10A is a schematic plan view. FIG. 10B is an equivalent circuit.

As shown in FIG. 10A, the semiconductor device 125 includes the first capacitor 45 and the first diode 46 in addition to the first transistor 10, the second transistor 20, and the first conductive member 71. The first cathode 46b is electrically connected to the first source 12 via the source pad 85s. The first anode 46a is electrically connected to the pad 85M. The pad 85M is electrically connected to the second gate 21 via the interconnect 72a.

Figure 11:
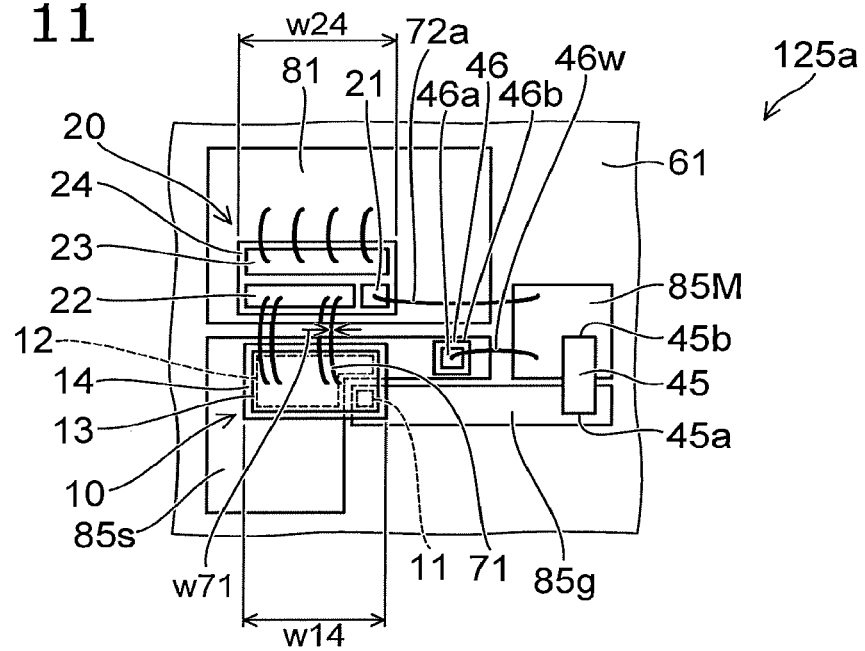
FIG. 11 is a schematic plan view illustrating another semiconductor device according to the first embodiment.

FIG. 11 is a schematic plan view illustrating another semiconductor device according to the first embodiment.

As shown in FIG. 11, the first diode 46 is provided in the semiconductor device 125a as well. The first cathode 46b is positioned between the first anode 46a and the source pad 85s. The first cathode 46b is electrically connected to the first source 12 via the source pad 85s. The first anode 46a is electrically connected to the pad 85M via the interconnect 46w.

The emission of the noise can be suppressed in the semiconductor devices 121, 122, 124, 125, and 125a as well.

Second Embodiment

Figure 12:
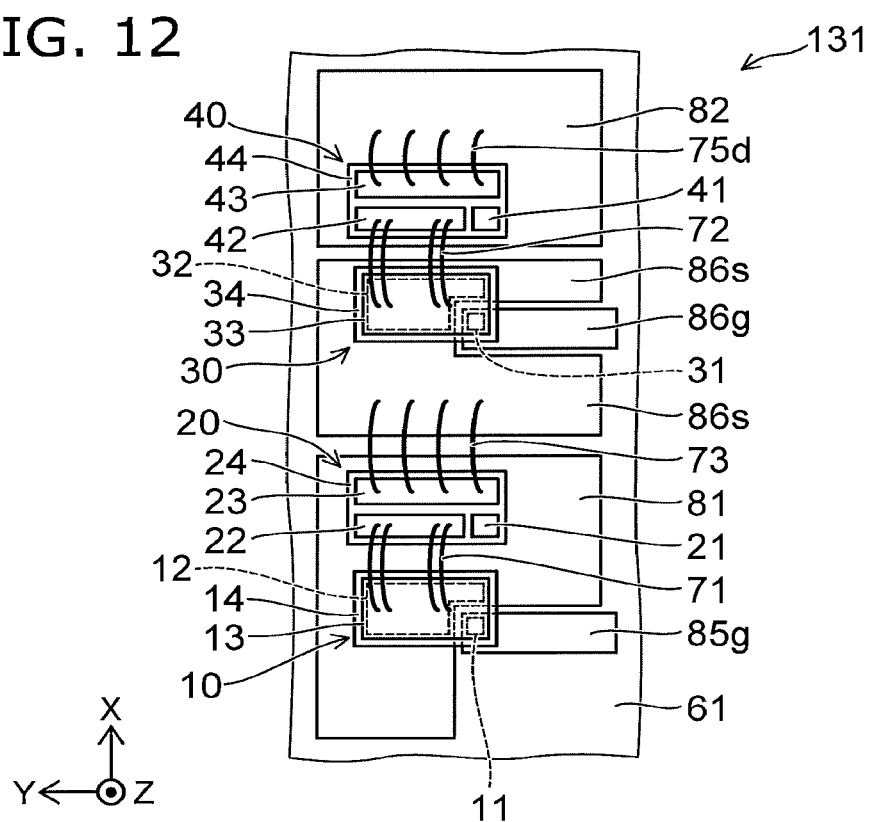
FIG. 12 is a schematic plan view illustrating a semiconductor device according to a second embodiment.

FIG. 12 is a schematic plan view illustrating a semiconductor device according to a second embodiment.

As shown in FIG. 12, the semiconductor device 131 according to the embodiment includes the first transistor 10, the second transistor 20, the first conductive member 71, a third transistor 30, a fourth transistor 40, and a second conductive member 72. For example, the first transistor 10, the second transistor 20, and the first conductive member 71 have the configurations described in reference to the semiconductor device 111. The third transistor 30, the fourth transistor 40, and the second conductive member 72 have the configurations described in reference to the semiconductor device 121. The third transistor 30 corresponds to the first transistor 10 of the semiconductor device 121. The fourth transistor 40 corresponds to the second transistor 20 of the semiconductor device 121. The second conductive member 72 corresponds to the first conductive member 71 of the semiconductor device 121.

Examples of the third transistor 30, the fourth transistor 40, and the second conductive member 72 will now be described.

The third transistor 30 is a transistor that is normally-off. The third transistor 30 includes a third gate 31, a third source 32, a third drain 33, and a third semiconductor member 34. The third gate 31, the third source 32, the third drain 33, and the third semiconductor member 34 correspond respectively to the first gate 11, the first source 12, the first drain 13, and the first semiconductor member 14 described above (referring to FIG. 1A to FIG. 1C). The description relating to FIG. 1A to FIG. 1C is applied to the third gate 31, the third source 32, the third drain 33, and the third semiconductor member 34. Examples of the third gate 31, the third source 32, the third drain 33, and the third semiconductor member 34 will now be described with reference to the first gate 11, the first source 12, the first drain 13, and the first semiconductor member 14 of FIG. 1A to FIG. 1C.

The direction from the third gate 31 toward the third source 32 crosses the first direction (the Z-axis direction). The third semiconductor member 34 is provided between the third gate 31 and the third drain 33 in the first direction and between the third source 32 and the third drain 33 in the first direction.

The first member 61 is provided in the example. For example, the third semiconductor member 34 is positioned between the first member 61 and the third drain 33 in the first direction. The third gate 31 is positioned between the first member 61 and the third semiconductor member 34 in the first direction. The third source 32 is positioned between the first member 61 and the third semiconductor member 34 in the first direction.

On the other hand, the fourth transistor 40 is a transistor that is normally-on. The fourth transistor 40 includes a fourth gate 41, a fourth source 42, a fourth drain 43, and a fourth semiconductor member 44. The fourth gate 41, the fourth source 42, the fourth drain 43, and the fourth semiconductor member 44 correspond respectively to the second gate 21, the second source 22, the second drain 23, and the second semiconductor member 24 described above (referring to FIG. 1A to FIG. 1C). The description relating to FIG. 1A to FIG. 1C is applied to the fourth gate 41, the fourth source 42, the fourth drain 43, and the fourth semiconductor member 44. Examples of the fourth gate 41, the fourth source 42, the fourth drain 43, and the fourth semiconductor member 44 will now be described with reference to the second gate 21, the second source 22, the second drain 23, and the second semiconductor member 24 of FIG. 1A to FIG. 1C.

The orientation from the fourth semiconductor member 44 toward the fourth gate 41, the orientation from the fourth semiconductor member 44 toward the fourth source 42, and the orientation from the fourth semiconductor member 44 toward the fourth drain 43 are the same as the orientation from the third semiconductor member 34 toward the third drain 33. The orientation from the third semiconductor member 34 toward the fourth semiconductor member 44 crosses the first direction (the Z-axis direction).

The first member 61 is provided in the example. For example, the fourth semiconductor member 44 is positioned between the first member 61 and the fourth gate 41. The fourth semiconductor member 44 is positioned between the first member 61 and the fourth source 42. The fourth semiconductor member 44 is positioned between the first member 61 and the fourth drain 43.

The first conductive member 71, the second conductive member 72, and a third conductive member 73 are provided. As described above, the first conductive member 71 electrically connects the first drain 13 and the second source 22. On the other hand, the second conductive member 72 electrically connects the third drain 33 and the fourth source 42. The third conductive member 73 electrically connects the second drain 23 and the third source 32.

An intermediate pad 86s is provided in the example. The intermediate pad 86s is electrically connected to the third source 32. The third conductive member 73 is electrically connected to the second drain 23 and the intermediate pad 86s. Thereby, the second drain 23 and the third source 32 are electrically connected.

The first conductive layer 81 and a second conductive layer 82 are provided in the example.

The first conductive layer 81 is electrically connected to the first source 12. As shown in FIG. 1C, the second semiconductor member 24 is positioned between the first conductive layer 81 and the second source 22. As shown in FIG. 1B, the second semiconductor member 24 is positioned between the first conductive layer 81 and the second drain 23.

The second semiconductor member 24 is positioned between the first conductive layer 81 and the second gate 21.

The second conductive layer 82 is electrically connected to the fourth drain 43. In the example, the second conductive layer 82 and the fourth drain 43 are electrically connected by the drain interconnect 75d. The second conductive layer 82 may have a configuration similar to the first conductive layer 81 illustrated in FIG. 7B and FIG. 7C. The fourth semiconductor member 44 is positioned between the second conductive layer and the fourth source 42. The fourth semiconductor member 44 is positioned between the second conductive layer 82 and the fourth drain 43. The fourth semiconductor member 44 is positioned between the second conductive layer 82 and the fourth gate 41.

The gate pad 85g and another gate pad 86g are provided in the example. The gate pad 85g is, for example, a low-side gate pad. The other gate pad 86g is, for example, a high-side gate pad. The gate pad 85g is electrically connected to the first gate 11. For example, the other gate pad 86g is electrically connected to the third gate 31.

In the semiconductor device 131, at least a portion of the second transistor 20 is positioned between the first transistor 10 and the fourth transistor 40. At least a portion of the third transistor 30 is positioned between the second transistor 20 and the fourth transistor 40. At least a portion of the first source 12 is positioned between the first gate 11 and the second transistor 20 in the direction (e.g., the X-axis direction) from the first transistor 10 toward the fourth transistor 40. At least a portion of the third source 32 is positioned between the third gate 31 and the fourth transistor 40 in the direction recited above from the first transistor 10 toward the fourth transistor 40.

Figure 13:
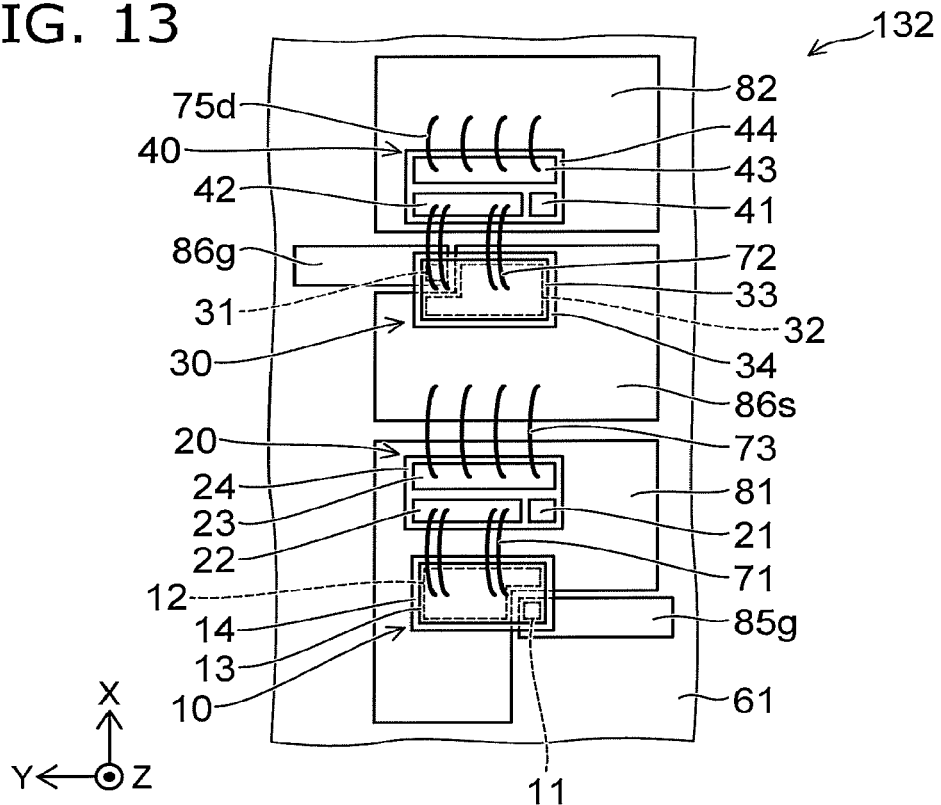
FIG. 13 is a schematic plan view illustrating other semiconductor devices according to the second embodiment.
Figure 14:
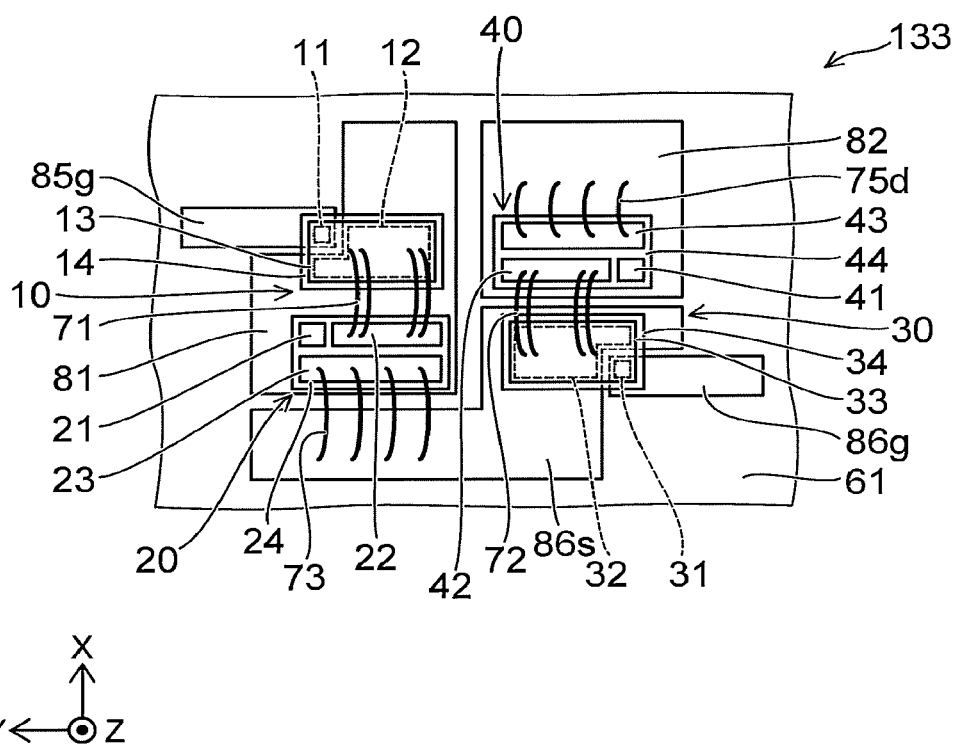
FIG. 14 is a schematic plan view illustrating other semiconductor devices according to the second embodiment.

FIG. 13 and FIG. 14 are schematic plan views illustrating other semiconductor devices according to the second embodiment.

As shown in FIG. 13 and FIG. 14, the semiconductor devices 132 and 133 also include the first transistor 10, the second transistor 20, the first conductive member 71, the third transistor 30, the fourth transistor 40, and the second conductive member 72. The arrangement of the components in the semiconductor devices 132 and 133 is different from the arrangement in the semiconductor device 131.

In the semiconductor devices 131 to 133, a set that includes two transistors having a cascode connection is multiply provided. A semiconductor device that has a high breakdown voltage can be provided. In the semiconductor devices 131 to 133 as well, a semiconductor device can be provided in which the emission of the noise can be suppressed.

In the semiconductor device 132, at least a portion of the second transistor 20 is positioned between the first transistor 10 and the fourth transistor 40. At least a portion of the third transistor 30 is positioned between the second transistor 20 and the fourth transistor 40. At least a portion of the first source 12 is positioned between the first gate 11 and the second transistor 20 in the direction (e.g., the X-axis direction) from the first transistor 10 toward the fourth transistor 40. At least a portion of the third gate 31 is positioned between the fourth transistor 40 and at least a portion of the third source 32 in the direction recited above from the first transistor 10 toward the fourth transistor 40.

In the semiconductor device 133, the direction from the first transistor 10 toward the fourth transistor 40 crosses the direction from the first transistor 10 toward the second transistor 20. The direction from the second transistor 20 toward the third transistor 30 crosses the direction from the first transistor 10 toward the second transistor 20. The direction from the second transistor 20 toward the third transistor 30 is aligned with the direction from the first transistor 10 toward the fourth transistor 40.

The semiconductor devices 131, 132, and 133 are, for example, half-bridge circuits. For example, the semiconductor devices 131, 132, and 133 can be used as power converters. A power converter that includes the semiconductor device according to the embodiment may include a full-bridge circuit including two half-bridge circuits. The two half-bridge circuits are connected in parallel in the full-bridge circuit. The power converter that includes the semiconductor device according to the embodiment may include three or more half-bridge circuits. The three or more half-bridge circuits may be connected in parallel.

Examples of the first transistor 10 (or the third transistor 30) and the second transistor (or the fourth transistor 40) will now be described.

Figure 15:
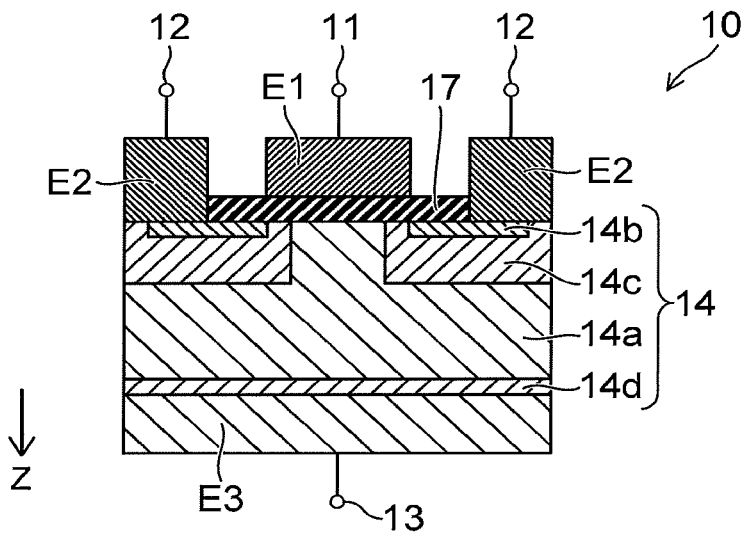
FIG. 15 is a schematic cross-sectional view illustrating a portion of the semiconductor device according to the embodiment.

FIG. 15 is a schematic cross-sectional view illustrating a portion of the semiconductor device according to the embodiment.

As shown in FIG. 15, the first transistor 10 (or the third transistor 30) includes the first semiconductor member 14, a first electrode E1, a second electrode E2, a third electrode E3, and an insulating film 17.

The first electrode E1 is electrically connected to the first gate 11. The second electrode E2 is electrically connected to the first source 12. The third electrode E3 is electrically connected to the first drain 13. The first electrode E1 may be the first gate 11. The second electrode E2 may be the first source 12. The third electrode E3 may be the first drain 13.

The first semiconductor member 14 is positioned between the first electrode E1 and the third electrode E3 and between the second electrode E2 and the third electrode E3.

In the example, the first semiconductor member 14 includes a first semiconductor region 14a, a second semiconductor region 14b, a third semiconductor region 14c, and a fourth semiconductor region 14d. These semiconductor regions are, for example, Si semiconductor layers. The fourth semiconductor region 14d is positioned between the first semiconductor region 14a and the third electrode E3. The third semiconductor region 14c is provided between the second electrode E2 and a portion of the first semiconductor region 14a. The second semiconductor region 14b is provided between the second electrode E2 and a portion of the third semiconductor region 14c. The insulating film 17 is provided between the first electrode E1 and a portion of the first semiconductor region 14a and between the first electrode E1 and a portion of the third semiconductor region 14c. The insulating film 17 is, for example, a gate insulating film. For example, the conductivity type of the first semiconductor region 14a is a low-concentration n-type. The conductivity type of the second semiconductor region 14b is a high-concentration n-type. The conductivity type of the third semiconductor region 14c is a p-type. The conductivity type of the fourth semiconductor region 14d is a high-concentration n-type.

Figure 16:
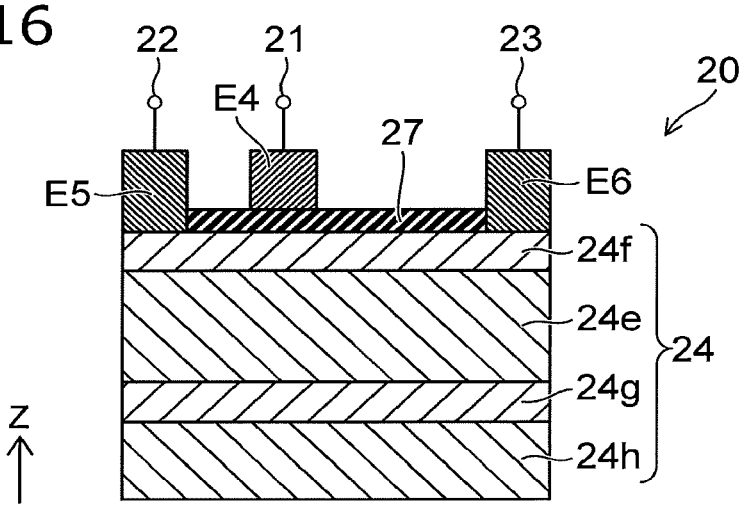
FIG. 16 is a schematic cross-sectional view illustrating a portion of the semiconductor device according to the embodiment.

FIG. 16 is a schematic cross-sectional view illustrating a portion of the semiconductor device according to the embodiment.

As shown in FIG. 16, the second transistor 20 (or the fourth transistor 40) include the second semiconductor member 24, a fourth electrode E4, a fifth electrode E5, a sixth electrode E6, and an insulating film 27.

The fourth electrode E4 is electrically connected to the second gate 21. The fifth electrode E5 is electrically connected to the second source 22. The sixth electrode E6 is electrically connected to the second drain 23. The fourth electrode E4 may be the second gate 21. The fifth electrode E5 may be the second source 22. The sixth electrode E6 may be the second drain 23.

In the example, the orientation from the second semiconductor member 24 toward the fifth electrode E5 and the orientation from the second semiconductor member 24 toward the sixth electrode E6 are the same as the orientation from the second semiconductor member 24 toward the fourth electrode E4.

In the example, the second semiconductor member 24 includes a fifth semiconductor region 24e and a sixth semiconductor region 24f. The fifth semiconductor region 24e includes, for example, $Al_{x1}Ga_{1-x1}N$ ($0 \leq x1 < 1$). The sixth semiconductor region 24f includes, for example, $Al_{x2}Ga_{1-x2}N$ ($0 < x2 \leq 1$ and $x1 < x2$). The fifth semiconductor region 24e includes, for example, GaN. The sixth semiconductor region 24f includes, for example, AlGaN.

In the example, the second semiconductor member 24 includes a buffer layer 24g and a substrate 24h. The buffer layer 24g is provided between the substrate 24h and the fifth semiconductor region 24e. The substrate 24h includes, for example, one of sapphire, GaN, or Si. The buffer layer 24g includes, for example, $Al_{z1}Ga_{1-z1}N$ ($0 \leq z1 \leq 1$).

The insulating film 27 is provided between the sixth semiconductor region 24f and the fourth electrode E4. The insulating film 27 is, for example, a gate insulating film.

According to the embodiments, a semiconductor device can be provided in which the emission of the noise can be suppressed.

In this specification, the state of being electrically connected includes the state in which a first conductor and a second conductor are in contact with each other. The state of being electrically connected includes the state in which a third conductor is provided in a current path between a first conductor and a second conductor, and a current flows in the current path. The state of being electrically connected includes the state in which a control element such as a switch or the like is provided in a current path between a first conductor and a second conductor, and a state in which a current flows in the current path is formable by an operation of the control element.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, conductive members, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first transistor being normally-off and including a first gate, a first source, a first drain, and a first semiconductor member, a direction from the first gate toward the first source crossing a first direction, the first direction being from the first semiconductor member toward the first drain, the first semiconductor member being provided between the first gate and the first drain in the first direction and between the first source and the first drain in the first direction;

a second transistor being normally-on and including a second gate, a second source, a second drain, and a second semiconductor member, an orientation from the first semiconductor member toward the first drain being the same as an orientation from the second semiconductor member toward the second gate, the same as an orientation from the second semiconductor member toward the second source, and the same as an orientation from the second semiconductor member toward the second drain, an orientation from the first semiconductor member toward the second semiconductor member crossing the first direction; and a first conductive member electrically connecting the first drain and the second source.

2. The device according to claim 1, further comprising:

a third transistor being normally-off and including a third gate, a third source, a third drain, and a third semiconductor member, a direction from the third gate toward the third source crossing the first direction, the third semiconductor member being provided between the third gate and the third drain in the first direction and between the third source and the third drain in the first direction;

a fourth transistor being normally-on and including a fourth gate, a fourth source, a fourth drain, and a fourth semiconductor member, an orientation from the third semiconductor member toward the third drain being the same as an orientation from the fourth semiconductor member toward the fourth gate, the same as an orientation from the fourth semiconductor member toward the fourth source, and the same as an orientation from the fourth semiconductor member toward the fourth drain, an orientation from the third semiconductor member toward the fourth semiconductor member crossing the first direction;

a second conductive member electrically connecting the third drain and the fourth source;

a third conductive member electrically connecting the second drain and the third source;

a first conductive layer electrically connected to the first source, the second semiconductor member being positioned between the first conductive layer and the second source; and a second conductive layer electrically connected to the fourth drain, the fourth semiconductor member being positioned between the second conductive layer and the fourth source.

3. The device according to claim 1, further comprising a first member, the first semiconductor member being positioned between the first member and the first drain, the first gate being positioned between the first member and the first semiconductor member, the first source being positioned between the first member and the first semiconductor member, the second semiconductor member being positioned between the first member and the second gate, the second semiconductor member being positioned between the first member and the second source, the second semiconductor member being positioned between the first member and the second drain.

4. A semiconductor device, comprising:

a first member;

a first transistor being normally-off and including a first gate, a first source, a first drain, and a first semiconductor member, a direction from the first member toward the first drain being aligned with a first direction, the first semiconductor member being positioned between the first member and the first drain in the first direction; the first gate being positioned between the first member and the first semiconductor member in the first direction, the first source being positioned between the first member and the first semiconductor member in the first direction;

a second transistor being normally-on and including a second gate, a second source, a second drain, and a second semiconductor member; the second semiconductor member being positioned between the first member and the second gate in the first direction, the second semiconductor member being positioned between the first member and the second source in the first direction, the second semiconductor member being positioned between the first member and the second drain in the first direction, a direction from the first semiconductor member toward the second semiconductor member crossing the first direction; and a first conductive member electrically connecting the first drain and the second source.

5. The device according to claim 3, further comprising a first conductive layer provided between the first member and the first source and between the first member and the second semiconductor member, the first conductive layer being electrically connected to the first source.

6. The device according to claim 5, further comprising a first insulating layer provided between the first conductive layer and the second semiconductor member.

7. The device according to claim 3, further comprising a first conductive layer electrically connected to the second drain, at least a portion of the first conductive layer being positioned between the first member and the second semiconductor member.

8. The device according to claim 7, further comprising a first insulating layer provided between the first conductive layer and the second semiconductor member.

9. The device according to claim 3, further comprising a first conductive layer provided between the first member and the second semiconductor member, the first conductive layer being electrically insulated from the first gate, the first source, the first drain, the second gate, the second source, and the second drain.

10. The device according to claim 3, further comprising:

a third transistor being normally-off and including a third gate, a third source, a third drain, and a third semiconductor member, a direction from the first member toward the third drain being aligned with the first direction, the third semiconductor member being positioned between the first member and the third drain in the first direction, the third gate being positioned between the first member and the third semiconductor member in the first direction, the third source being positioned between the first member and the third semiconductor member in the first direction;

a fourth transistor being normally-on and including a fourth gate, a fourth source, a fourth drain, and a fourth semiconductor member, the fourth semiconductor member being positioned between the first member and the fourth gate in the first direction, the fourth semiconductor member being positioned between the first member and the fourth source in the first direction, the fourth semiconductor member being positioned between the first member and the fourth drain in the first direction, a direction from the third semiconductor member toward the fourth semiconductor member crossing the first direction;

a second conductive member electrically connecting the first drain and the second source; and a third conductive member electrically connecting the second drain and the third source.

11. The device according to claim 10, further comprising a second conductive layer electrically connected to the fourth drain, at least a portion of the second conductive layer being positioned between the first member and the fourth semiconductor member.

12. The device according to claim 11, further comprising a second insulating layer provided between the second conductive layer and the fourth semiconductor member.

13. The device according to claim 2, wherein at least a portion of the second transistor is positioned between the first transistor and the fourth transistor, at least a portion of the third transistor is positioned between the second transistor and the fourth transistor, at least a portion of the first source is positioned between the first gate and the second transistor in a direction from the first transistor toward the fourth transistor, and at least a portion of the third source is positioned between the third gate and the fourth transistor in the direction from the first transistor toward the fourth transistor.

14. The device according to claim 2, wherein at least a portion of the second transistor is positioned between the first transistor and the fourth transistor, at least a portion of the third transistor is positioned between the second transistor and the fourth transistor, at least a portion of the first source is positioned between the first gate and the second transistor in a direction from the first transistor toward the fourth transistor, and at least a portion of the third gate is positioned between the fourth transistor and at least a portion of the third source in the direction from the first transistor toward the fourth transistor.

15. The device according to claim 2, wherein a direction from the first transistor toward the fourth transistor crosses a direction from the first transistor toward the second transistor, and a direction from the second transistor toward the third transistor crosses the direction from the first transistor toward the second transistor.

16. The device according to claim 1, further comprising a second conductive member electrically connecting the first source and the second gate.

17. The device according to claim 1, further comprising:

a first capacitor, a first end of the first capacitor being electrically connected to the first gate, a second end of the first capacitor being electrically connected to the second gate; and a first diode, a first anode of the first diode being electrically connected to the second gate, a first cathode of the first diode being electrically connected to the first source.

18. The device according to claim 1, wherein a width of the first conductive member along a cross direction is narrower than a width of the first semiconductor member along the cross direction, the cross direction crossing an extension direction of the first conductive member.

19. The device according to claim 1, wherein a position of the second source in a second direction is between a position of the first drain in the second direction and a position of the second drain in the second direction, the second direction being from the second source toward the second drain.

20. The device according to claim 1, wherein the orientation from the first semiconductor member toward the first drain and the orientation from the second semiconductor member toward the second gate are both bottom-to-top orientations.

* * * * *